United States Patent
Pichumani et al.

(10) Patent No.: US 12,218,076 B2
(45) Date of Patent: Feb. 4, 2025

(54) NANOPHOTONIC CRACK STOP DESIGN

(71) Applicant: META PLATFORMS, INC., Menlo Park, CA (US)

(72) Inventors: Pradip Sairam Pichumani, Bellevue, WA (US); Sandeep Rekhi, San Jose, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 17/688,716

(22) Filed: Mar. 7, 2022

(65) Prior Publication Data
US 2023/0280530 A1 Sep. 7, 2023

(51) Int. Cl.
| | | |
|---|---|---|
| *H01L 23/00* | (2006.01) | |
| *G01N 21/95* | (2006.01) | |
| *G02B 6/12* | (2006.01) | |
| *G02B 6/124* | (2006.01) | |

(52) U.S. Cl.
CPC ....... *H01L 23/562* (2013.01); *G01N 21/9505* (2013.01); *G02B 6/124* (2013.01); *G02B 2006/12061* (2013.01); *G02B 2006/12138* (2013.01)

(58) Field of Classification Search
CPC . H01L 23/3142; H01L 23/564; H01L 23/562; G02B 2006/12119; G02B 6/30; G02B 6/4248
See application file for complete search history.

(56) References Cited

U.S. PATENT DOCUMENTS

| | | | |
|---|---|---|---|
| 6,975,800 B2 | 12/2005 | Dultz et al. | |
| 7,519,257 B2 | 4/2009 | Lipson et al. | |
| 7,795,615 B2 * | 9/2010 | Goebel | H01L 23/5223 438/18 |
| 8,168,474 B1 * | 5/2012 | Adkisson | H01L 21/76898 438/106 |
| 8,298,917 B2 * | 10/2012 | Andry | H01L 21/78 438/464 |
| 8,357,996 B2 * | 1/2013 | Mieczkowski | H01L 21/78 438/460 |
| 8,573,030 B2 | 11/2013 | Gole | |
| 9,064,697 B2 | 6/2015 | Arriagada et al. | |
| 10,068,859 B1 | 9/2018 | Polomoff et al. | |
| 2007/0221613 A1 * | 9/2007 | Gutsche | B81B 3/0072 216/57 |
| 2008/0080806 A1 | 4/2008 | Ho et al. | |
| 2011/0274393 A1 | 11/2011 | Reed et al. | |

(Continued)

FOREIGN PATENT DOCUMENTS

WO 2011017772 A1 2/2011

OTHER PUBLICATIONS

International Search Report and Written Opinion for International Application No. PCT/US2023/014556, mailed Jun. 19, 2023, 9 pages.

(Continued)

*Primary Examiner* — Ryan A Lepisto
*Assistant Examiner* — Erin D Chiem
(74) *Attorney, Agent, or Firm* — BakerHostetler

(57) ABSTRACT

A semiconductor design that uses high refractive index material between low refractive index material. This structure may act as an optical waveguide.

20 Claims, 10 Drawing Sheets

(56) References Cited

U.S. PATENT DOCUMENTS

| | | | |
|---|---|---|---|
| 2014/0042594 A1* | 2/2014 | Ayotte | H01L 22/20 |
| | | | 257/E21.259 |
| 2015/0097257 A1* | 4/2015 | Gambino | G02B 6/122 |
| | | | 438/69 |
| 2015/0097271 A1* | 4/2015 | Ayotte | H01L 21/02118 |
| | | | 438/759 |
| 2020/0066656 A1* | 2/2020 | Polomoff | H01L 24/05 |
| 2020/0158959 A1 | 5/2020 | Ardalan et al. | |
| 2021/0305172 A1* | 9/2021 | Polomoff | H01L 31/02005 |
| 2022/0308297 A1* | 9/2022 | Polomoff | G02B 6/30 |

OTHER PUBLICATIONS

Gokbulut B., et al., "Humidity Induced Inhibition and Enhancement of Spontaneous Emission of Dye Molecules in a Single PEG Nanofiber," Optical Materials Express, Mar. 2018, vol. 8, No. 3, pp. 568-580.

International Preliminary Report on Patentability for International Application No. PCT/US2023/014556, mailed Sep. 19, 2024, 7 pages.

* cited by examiner

NANOPHOTONIC CRACK STOP DESIGN

TECHNOLOGICAL FIELD

Exemplary embodiments of this disclosure relate generally to methods or apparatuses for nanophotonic crack stop design.

BACKGROUND

Crack stop structures (i.e., inner crack stop, outer crack stop, perimeter stitch, delamination sensor) are critical structures present along the periphery of the die (Si or III-V material) and serve to prevent crack propagation into the die (during wafer dicing, assembly, transport, and regular usage). These structures are present irrespective of the die size (small or large) and provide much needed protection to the sensitive structures inside (transistors—memory and logic and the metal traces that connect to them). The downside to the conventional design is it occupies valuable real estate. These structures together occupy ~35 microns to 100 microns on each side of the die and being electrically connected, the contact pad array connecting these structures to input and output occupy 1500 microns×150 microns of valuable real estate (especially in small form factor dies).

BRIEF SUMMARY

The conventional crack stop is designed with crack resistant conductive and polymeric layer stack trenched into the substrate with lithography or laser-ultrasonic technology. Methods and systems disclosed herein for semiconductor crack stop design may use a high refractive index material sandwiched in low refractive index material. This structure may act as an optical waveguide. In an example, a semiconductor chip may comprise an inner or outer crack stop structure; and a waveguide, wherein the waveguide directs light along the perimeter of the semiconductor chip.

Advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

Figure 1A:
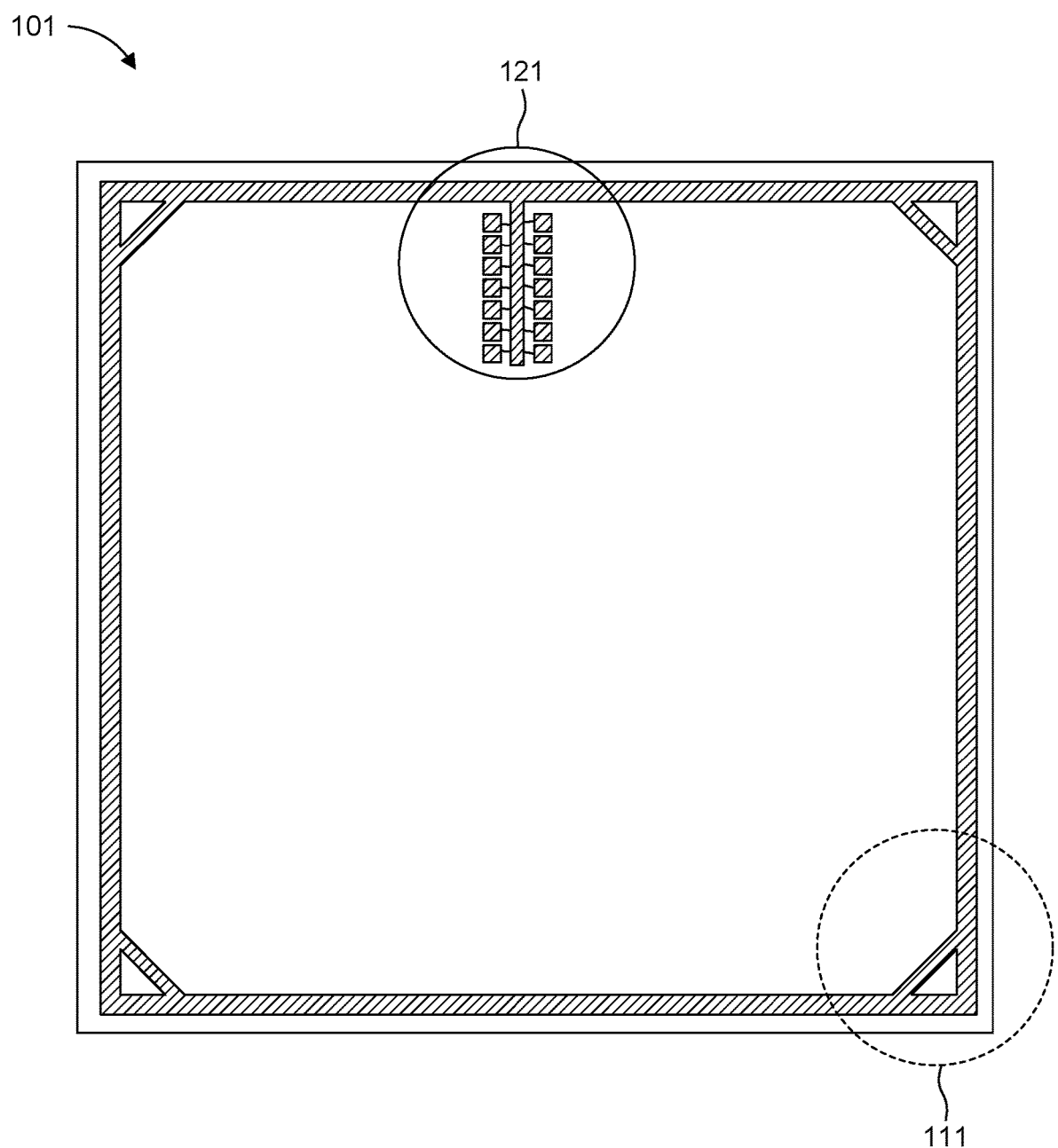
FIG. 1A illustrates an exemplary top-down view of a conventional semiconductor chip.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein. Like reference numerals refer to like elements throughout.

It is to be understood that the methods and systems described herein are not limited to specific methods, specific components, or to particular implementations. It is also to be understood that the terminology used herein is for the purpose of describing particular embodiments only and is not intended to be limiting.

Figure 1B:
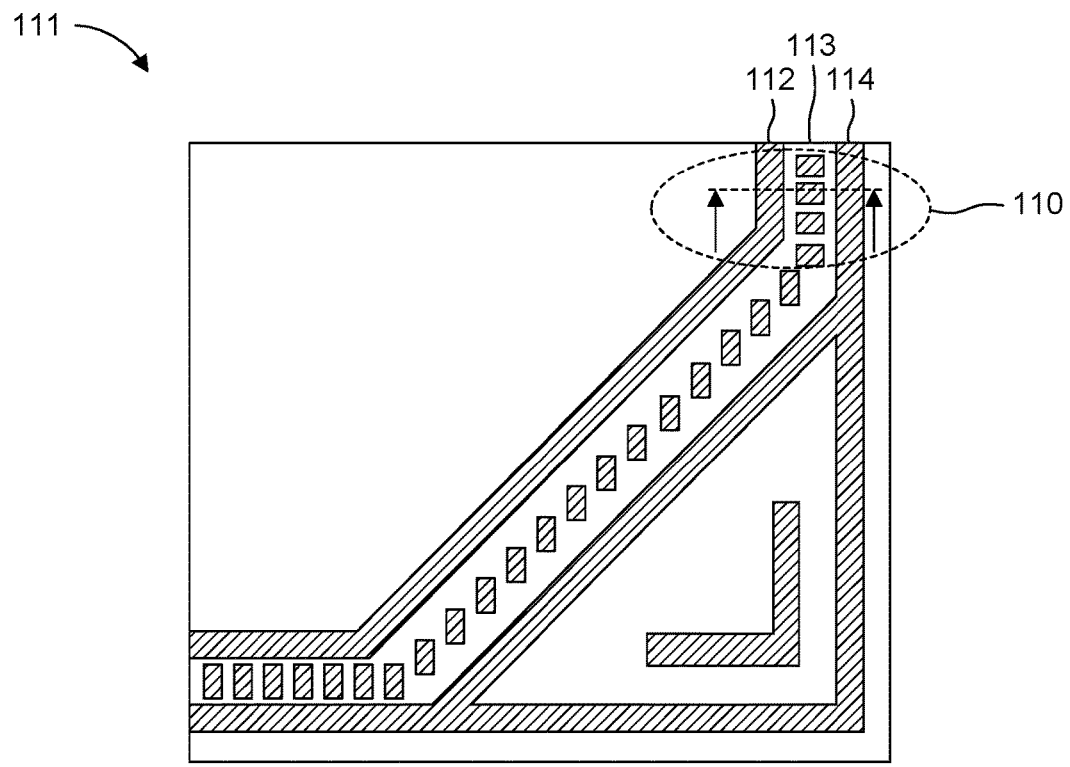
FIG. 1B illustrate an exemplary zoomed-in corner area of FIG. 1A.
Figure 1C:
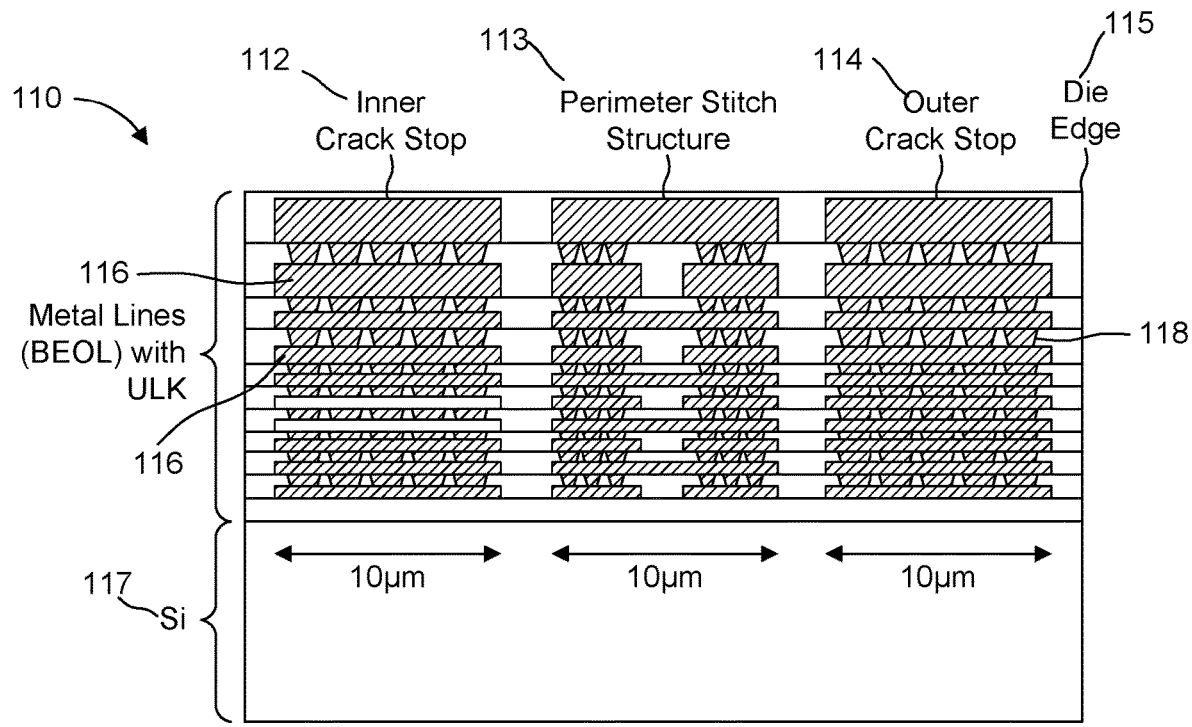
FIG. 1C illustrates an exemplary cross section associated with corner area in accordance with FIG. 1B.

FIG. 1A illustrates an exemplary top-down view of a conventional semiconductor chip 101 (e.g., a die), which highlights corner area 111 and contact pad area 121. FIG. 1B illustrates an exemplary zoomed-in corner area 111. Corner area 111 includes inner crack stop 112, perimeter stitch structure 113, or outer crack stop 114. FIG. 1C illustrates an exemplary cross section 110 associated with corner area 111. As shown in FIG. 1C, there may be silicon 117 at the base, multiple metal lines 116, and associated inner crack stop 112, perimeter stitch structure 113, outer crack stop 114, or die edge 115. Inner crack stop 112, perimeter stitch structure 113, or outer crack stop 114 may each be approximately 10 micrometers (e.g., 10 microns) in width, therefore 30 microns to 50 microns in total.

In a conventional design, the conventional crack stops (e.g., inner crack stop 112, perimeter stitch structure 113, or outer crack stop 114) are designed to be crack resistant and they are made of conductive and volumetric layer stacks that are patterned into the substrate through the lithography process and the use of technology such as laser ultrasonic technology. In the conventional crack-stop there is ultra-low-K (ULK) materials with copper usually being the material of choice for the crack-stop design. Crack stop structures are stacked on top of one another with these ultra-low-key material as the insulator in between them.

The disclosed design further described with regard to FIG. 2A-FIG. 2E, may utilize high-refractive index material that is sandwiched between low-refractive index material. High refractive index material may be used so that the light being used may be contained. The combination of low and high refractive index ensures that the light travels substantially within the material which has a high refractive index. For example, high refractive index regions have an index of refraction of approximately at least 3.48, and the low refractive index gap has an index of refraction of approximately at most 1.46. Many different structures may be used that provide a class of waveguide structures capable of guiding and confining light in such a way that optical intensity is obtained in a small cross-sectional area filled with any material with sufficiently low refractive index, relative to the remainder core of the structure. As designed, the high refractive index material may be set into the semiconductor chip to act as a channel which is contrary to conventional architectures. The waveguide should have the higher refractive index value relative to the surrounding material.

With reference to FIG. 1C which illustrates an exemplary cross-section of a crack stop, the conventional crack-stop structure may be considered a metal wall (a combination of metal lines and vias (e.g., via 118) over a plurality of metallization levels) introduced around the periphery of a chip. The crack stop may be a protective barrier to prevent cracks from propagating inside of semiconductor chip 101. In an example, cracks may form during the manufacturing process, such as dicing a die (e.g., semiconductor chip 101) from a larger wafer. Other events or processes may introduce cracks, such as the laser building process, the packaging process, testing, or even normal usage. Conventionally each semiconductor chip 101 may be relatively large, such as 40 millimeters by 40 millimeters, therefore there may be a perception that there is no problem in having structures that are 50 microns to 60 microns, occupying 50 to 60 microns on the edges. But when semiconductor chip 101 is significantly smaller (e.g., 5 millimeters by 5 millimeters or even smaller), particularly for advanced electronics (e.g., consumer electronics) where there is an attempt to have ultra-thin form factor then the use of 50 to 60 microns of space may be particularly significant. A single micron may be valuable real estate that may need to be utilized for putting in value-added transistor arrays or logic nets. And so, the conventional crack stop structures are relatively big and bulky when semiconductor chip 101 is of a small form factor.

As shown in cross section 110, inner crack stop 112, perimeter stitch structure 113, or outer crack stop 114 may have metal lines 116 that are connected with one another with vias 118, wherein ultra-low-key (ULK) material is usually present between the metal (e.g., copper may be the metal). The ultra-low-key material (e.g., the dielectric material that is non-conductive) may be brittle. A reason the ultra-low-key material may be used (e.g., ultra-low dielectric constant) is because these metal structures are close to one another, and this configuration deters capacitance formation that may have a negative effect on performance.

Since the ultra-low-key materials are brittle, the design of these crack stops are such that vias 118 and metal lines 116 are placed in such a way that they prevent cracks from propagating. This system is an auto-crack stop which is roughly about 10 microns in width each, for example, but may be larger or smaller based on the foundry used and the crack stop design. The crack stops together (e.g., inner crack stop 112, perimeter stitch structure 113, and outer crack stop 114) may occupy about 40 microns of valuable real estate per edge, and this reduces the usable footprint of semiconductor chip 101. The disclosed subject matter may allow for an increase in the usable area of semiconductor chip 101 for transistor arrays, logic nets, or the like when compared to conventional approaches.

Figure 1D:
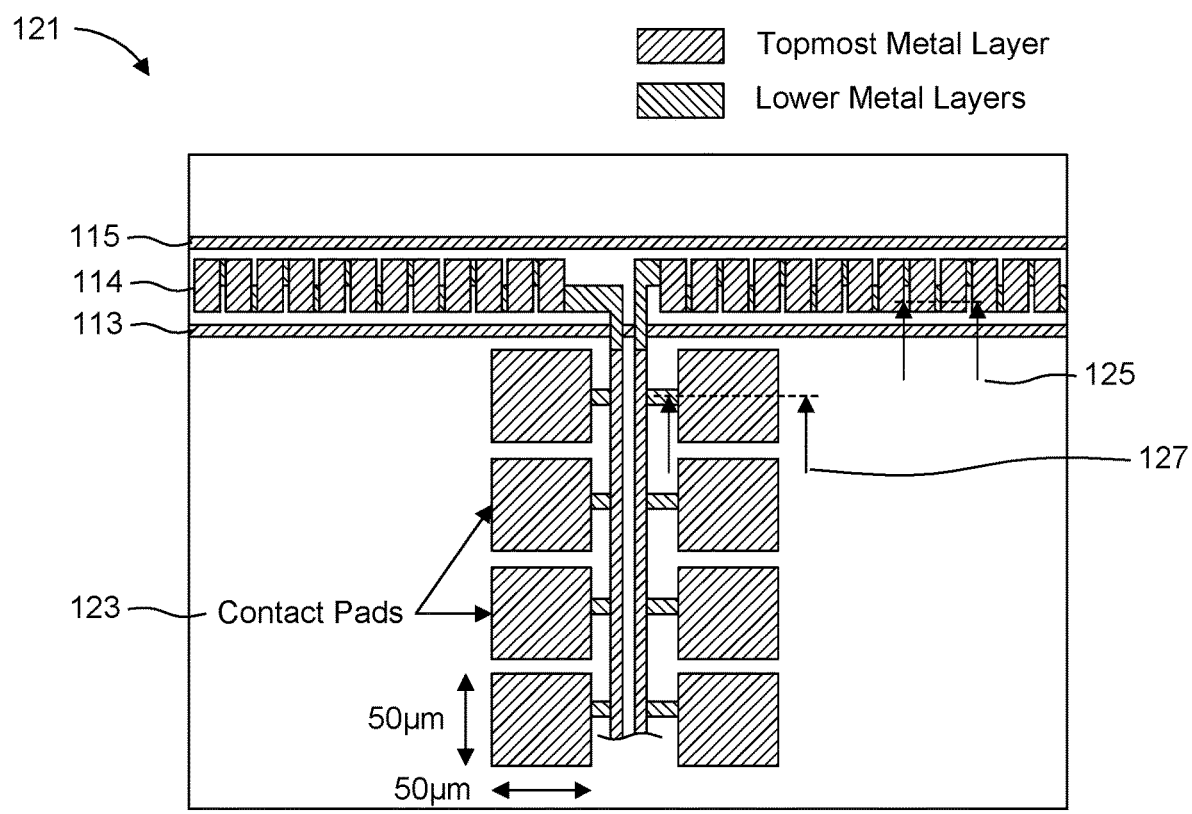
FIG. 1D illustrates an exemplary zoomed-in contact pad area of FIG. 1A.
Figure 1E:
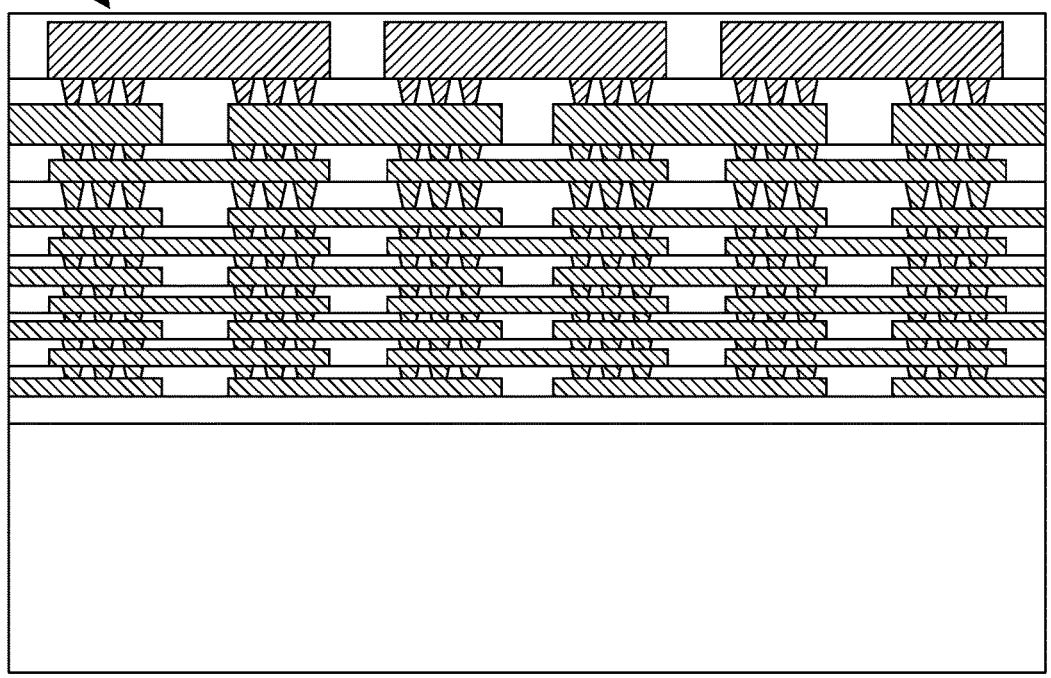
FIG. 1E illustrates an exemplary cross section associated with contact pad area in accordance with FIG. 1D.
Figure 1F:
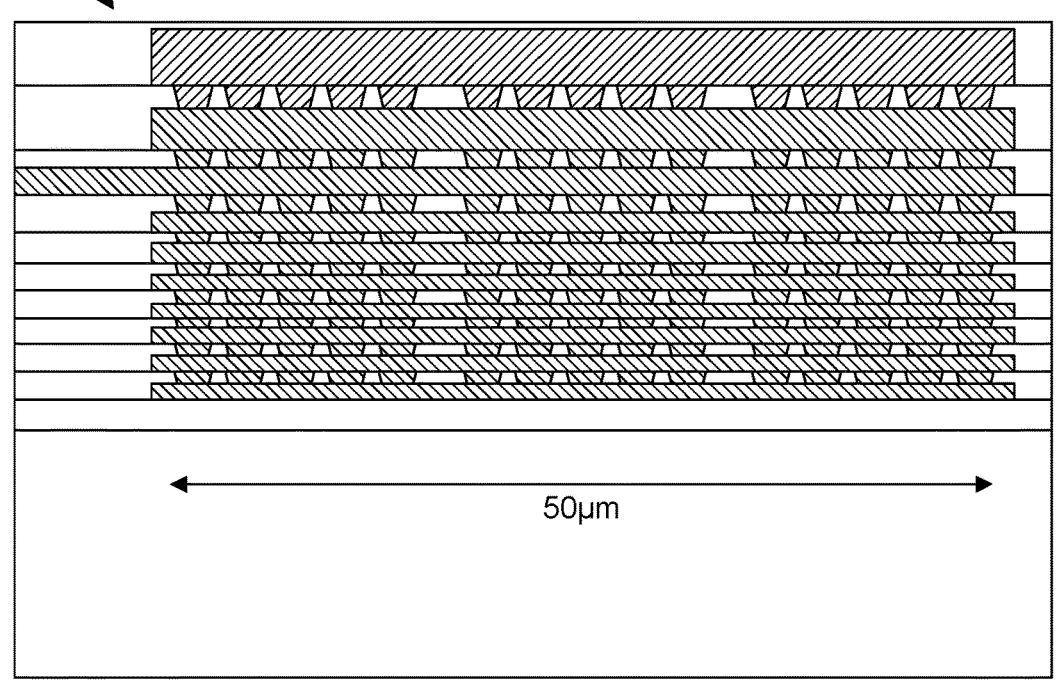
FIG. 1F illustrates an exemplary cross section associated with contact pad area in accordance with FIG. 1D.

FIG. 1D illustrates an exemplary zoomed-in contact pad area 121. Contact pad area 121 includes contact pads 123, inner crack stop 112, perimeter stitch structure 113, or outer crack stop 114. Cross section 125 and cross section 127 are described in more detail herein. FIG. 1E illustrates an exemplary cross section 125 that is associated with contact pad area 121. FIG. 1F illustrates an exemplary cross section 127 that is associated with contact pad area 121. Each contact pad 123 may be approximately 50 microns by 50 microns.

Conventional crack stop structures need to be connected electrically in order to execute a built-in self-test, which may help determine the condition of semiconductor chip 101, such as cracking. Apart from crack stop structures occupying the corners and the perimeter of semiconductor chip 101, there is a significant portion of semiconductor chip 101 occupied by contact pads 123, which may connect the circuitry that will power crack stops for the built-in self-test. Semiconductor chip 101 may have a simple input and output connection, or the connection may be a kelvin connection, a diode connection, or the like. The number of contact pads that are added depends on the type of connection and may range from 5 pads to 30 pads.

FIG. 2A-FIG. 2E illustrates an exemplary semiconductor chip 131 (e.g., die) that utilizes a structure of high-refractive index material that are sandwiched between low-refractive index material. In an exemplary design, nanophotonic sensors or nanocavities may be implemented in place of in conjunction with conventional copper and other structures. Waveguide 143 may be a nanophotonic sensor that carries light from an input (e.g., an input sourced at grating area 151) to output which may be coupled with a photo detector or the like that may be connected with semiconductor chip 131 in grating area 151. Waveguide 143 may be positioned near the perimeter of semiconductor chip 131 between an inner nanocavity array 142 142 (e.g., an inner crack stop structure) and an outer nano activity array 144 (e.g., outer crack stop structure). Waveguide 143 (also referred herein as nanophotonic sensor 143) may use light, rather than using electrical pulses, to form a connection and serve as a signaling connection in the nanophotonic crack stop structure.

Figure 2A:
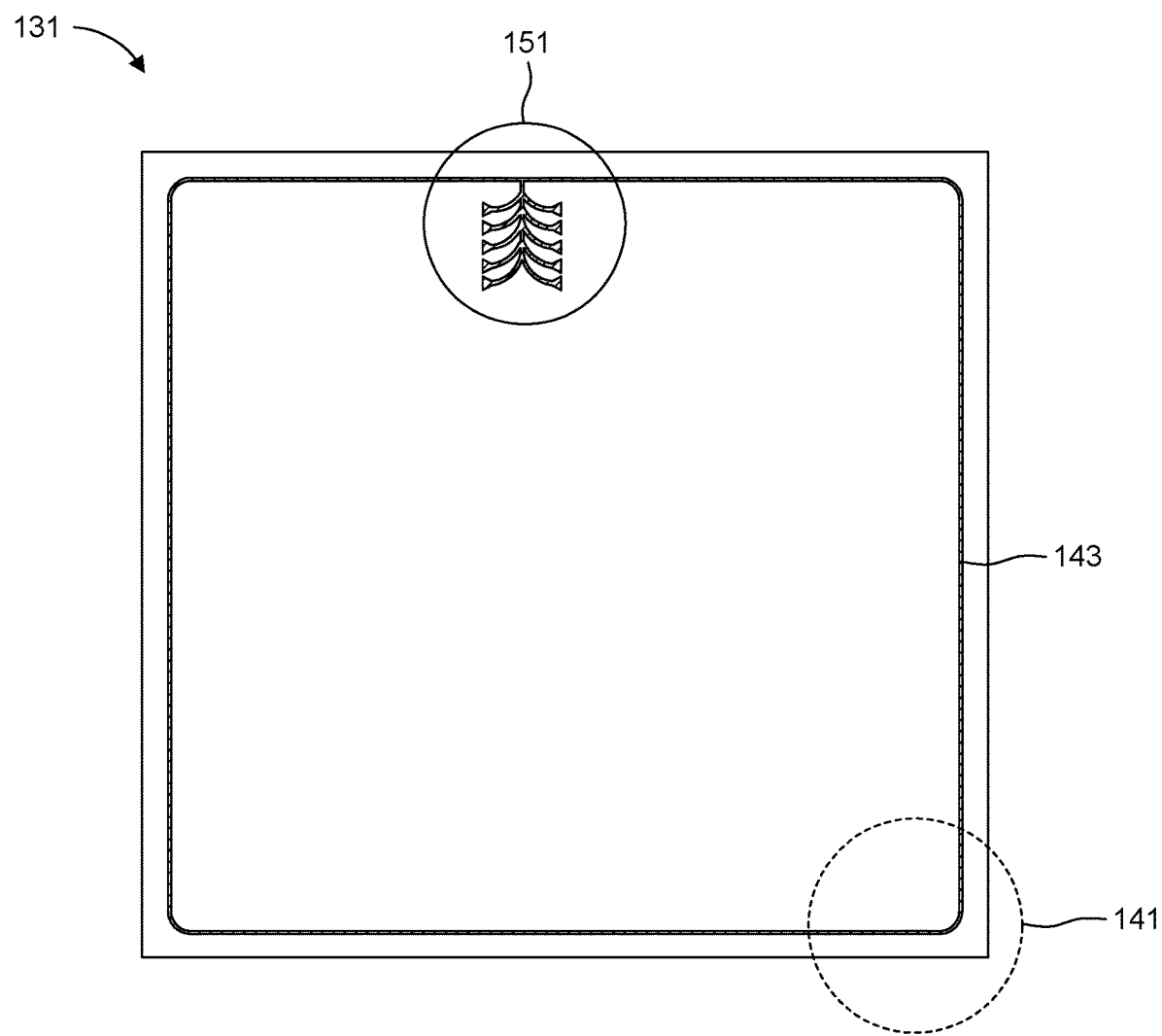
FIG. 2A illustrates an exemplary top-down view of a semiconductor chip.
Figure 2B:
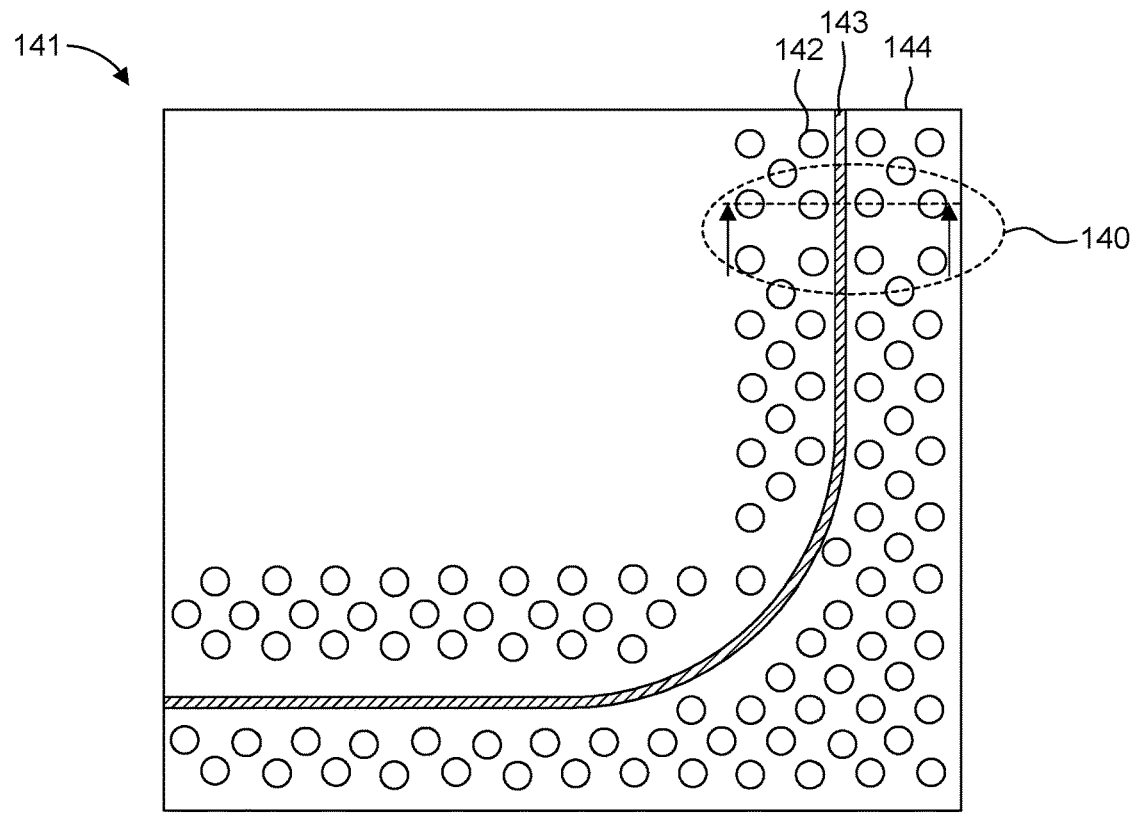
FIG. 2B illustrate an exemplary zoomed-in corner area of FIG. 2A.
Figure 2C:
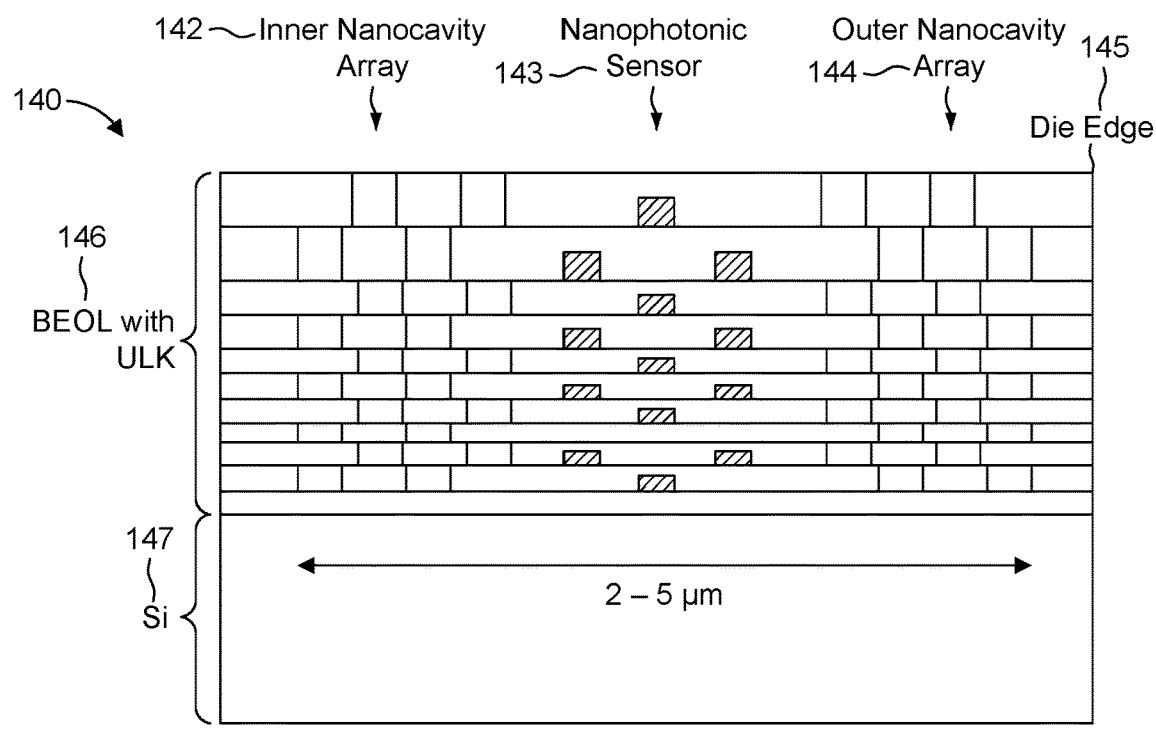
FIG. 2C illustrates an exemplary cross section associated with corner area in accordance with FIG. 2B.

FIG. 2B illustrate an exemplary zoomed-in corner area 141. Corner area 141 includes inner nano activity array 142, waveguide 143, or outer nano activity array 144. FIG. 2C illustrates an exemplary cross section 140 associated with corner area 141. As shown in FIG. 2C, there may be silicon substrate 147 at the base, backend of lines (BEoL) 146 with ULK, and associated inner nano activity array 142, waveguide 143, outer nano activity array 144, or die edge 145. Inner nano activity array 142, waveguide 143, or outer nano activity array 144 may be approximately 2 microns to 5 microns in width in total.

Nanocavity areas (e.g., inner nano activity array 142 or outer nano activity array 144) may be used to contain the light within waveguide 143. Inner nano activity array 142 or outer nano activity array 144 may be small trenches (e.g., cylindrical) added on either side of waveguide 143 and they may be constructed this way for light containment or as a crack stop.

In an example scenario with regard to the disclosed nanocavity design, when a crack starts it propagation from die edge 145 into the inner layers of semiconductor chip 131, as soon as the propagating crack hits a cavity, it stops propagating any further, because the cavity dissipates the propagation energy. The staggered pattern of the nanocavity area helps stop crack propagation if the crack meanders, which may be an advantage of using this type of nanocavity design.

Figure 2D:
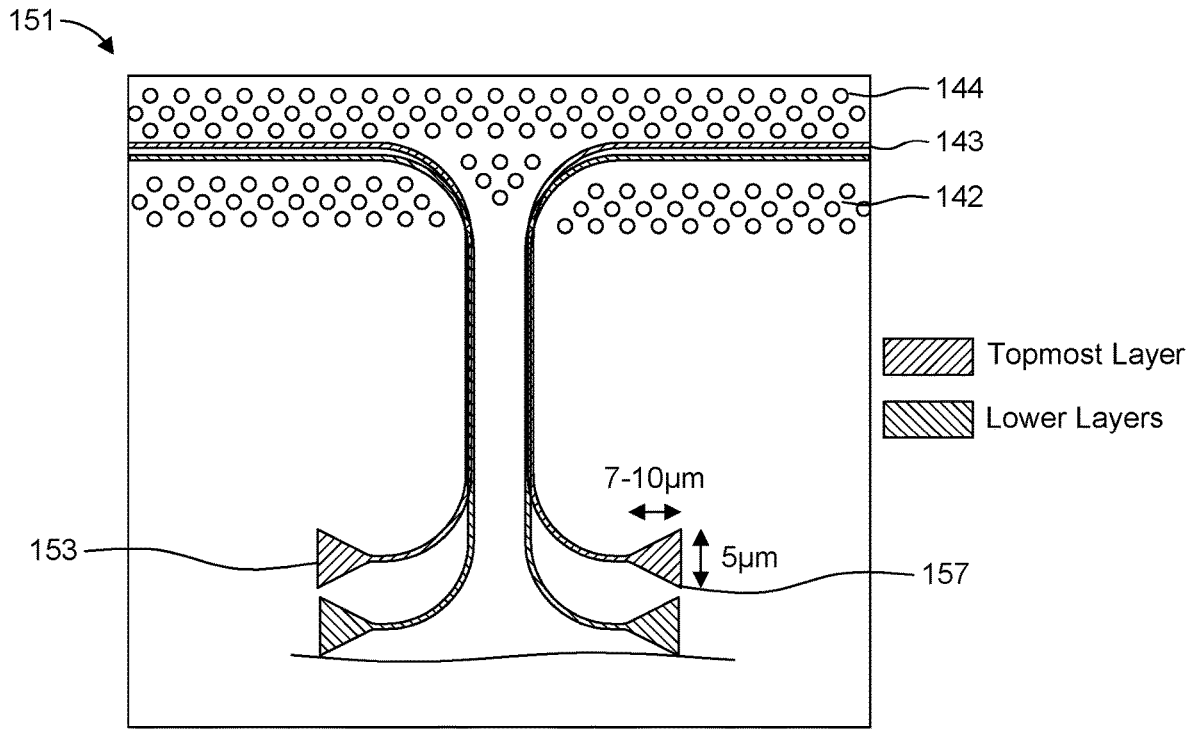
FIG. 2D illustrates an exemplary zoomed-in waveguide gratings area of FIG. 2A.
Figure 2E:
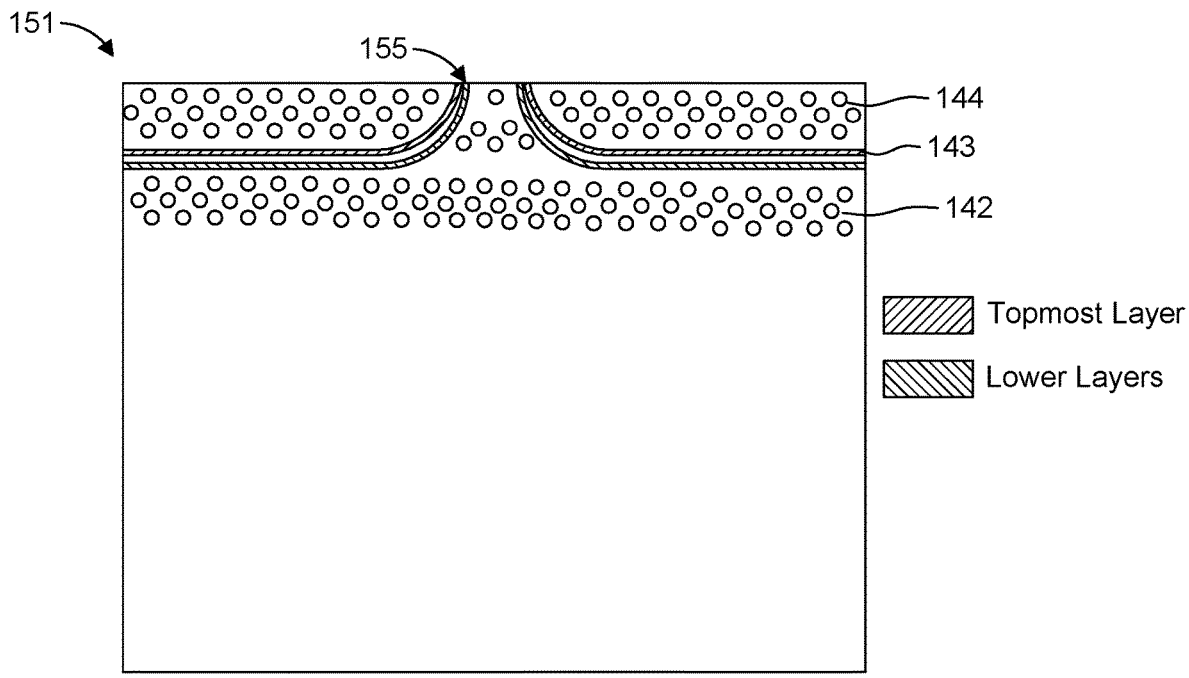
FIG. 2E illustrates zoomed-in edge coupling area.

FIG. 2D illustrates an exemplary zoomed-in waveguide grating area 151. Waveguide grating area 151 includes waveguide gratings 153 (e.g., similar to contact pads 123), inner nano activity array 142, waveguide 143, or outer nano activity array 144. For the disclosed nanophotonic semiconductor designs (e.g., semiconductor chip 131), waveguide 143 may be in the nanometer range. Waveguide gratings 153, as an example, may be five microns by seven microns in dimensions, which may be significantly less than that of conventional contact pads 123. FIG. 2E illustrates an exemplary zoomed-in waveguide grating area 151, but without contact pads (e.g., an edge coupling area in this instance). Waveguide grating area 151 of FIG. 2E includes waveguide 143 that is directed to die edge 145 in which there may be an edge coupling 155 that connects with an apparatus that may transmit light. FIG. 2E includes inner nano activity array 142, waveguide 143, or outer nano activity array 144. In this example, waveguide 143 is diverted towards die edge 145 and edge coupling 155. Edge coupling 155 may direct light to or through waveguide 143 or an external apparatus (not shown) that may be added on the side wall of semiconductor chip 131 or another position.

With reference to FIG. 2D or FIG. 2E, edge coupling 155 or waveguide grating 153 may receive light from a laser or other source. The structures are directed to the die edge for butt coupling of light input and detector output. In an example, there may be an input light source at waveguide grating 153 and an output of the light at waveguide grating 157. An analysis of variations in light traveling through waveguide 143 channels may help determine the condition (e.g., verify the integrity) of semiconductor chip 131, such as testing for crack propagation, electrical continuity, humidity, moisture, or delamination, among other things. This analysis may be based on a built-in self-test that occurs periodically, such as when semiconductor chip 131 is powered on. In an example scenario, detected light leakage (e.g., reduction of intensity of light) or light alteration may be an indication of a propagated crack or addition of moisture in semiconductor chip 131.

The nanophotonic designs may vary in complexity in which there may be a single input and output, or multiple inputs and outputs. In an example, there may be a corresponding waveguide 143 for each layer of semiconductor chip 131. Therefore, if there are four layers then there may be four waveguides 143 and four sets of waveguide gratings, in which an input waveguide grating 153 and output waveguide grating 157 may be considered a set. Yet there may be other nanophotonic designs in which there is a coupling (e.g., evanescent coupling) to each through the layers with just a single input and a single output. In another design, there may be an injection of multiple different wavelengths of light on the same layer or different layers that may be used for different detection scenarios.

The disclosed nanophotonic structure allows for simpler circuitry and structures compared to the conventional structures that have multiple vias, multiple metal pads, and lithography-based which includes non-usable die.

The conventional consideration of crack stop material may be based on the reduction or elimination of coefficient of thermal expansion (CTE) mismatches. Each material has an amount of expansion at a certain temperature (e.g., CTE), such as copper has a first CTE value and silicon has a second CTE value. CTE mismatches may be a significant issue because it may cause an inherent residual stress inside a semiconductor chip 101. Therefore, there are general considerations regarding reducing this mismatch as much as possible. The disclosed nanophotonic design (e.g., semiconductor chip 131) may address CTE mismatch issues, particularly for the corners or edges of semiconductor chip 101 which are usually significantly impacted by CTE mismatches. Because the materials of the disclosed subject matter may have a CTE near or close to the dielectric material (e.g., the ultra-low-key material), CTE mismatch may be managed more easily.

The disclosed nanophotonic design allows for the use of some conventional semiconductor device fabrication processes or devices, such as some of the standard lithography processes or devices for patterning semiconductors. Unique combination using the disclosed subject matter are contemplated, such as using conventional copper-related patterning on the inside crack stop while still having a different type of patterning process on the outside crack stop. The disclosed nanophotonic structure may use of different vias and masks for different types of structures and novel combinations.

Figure 3:
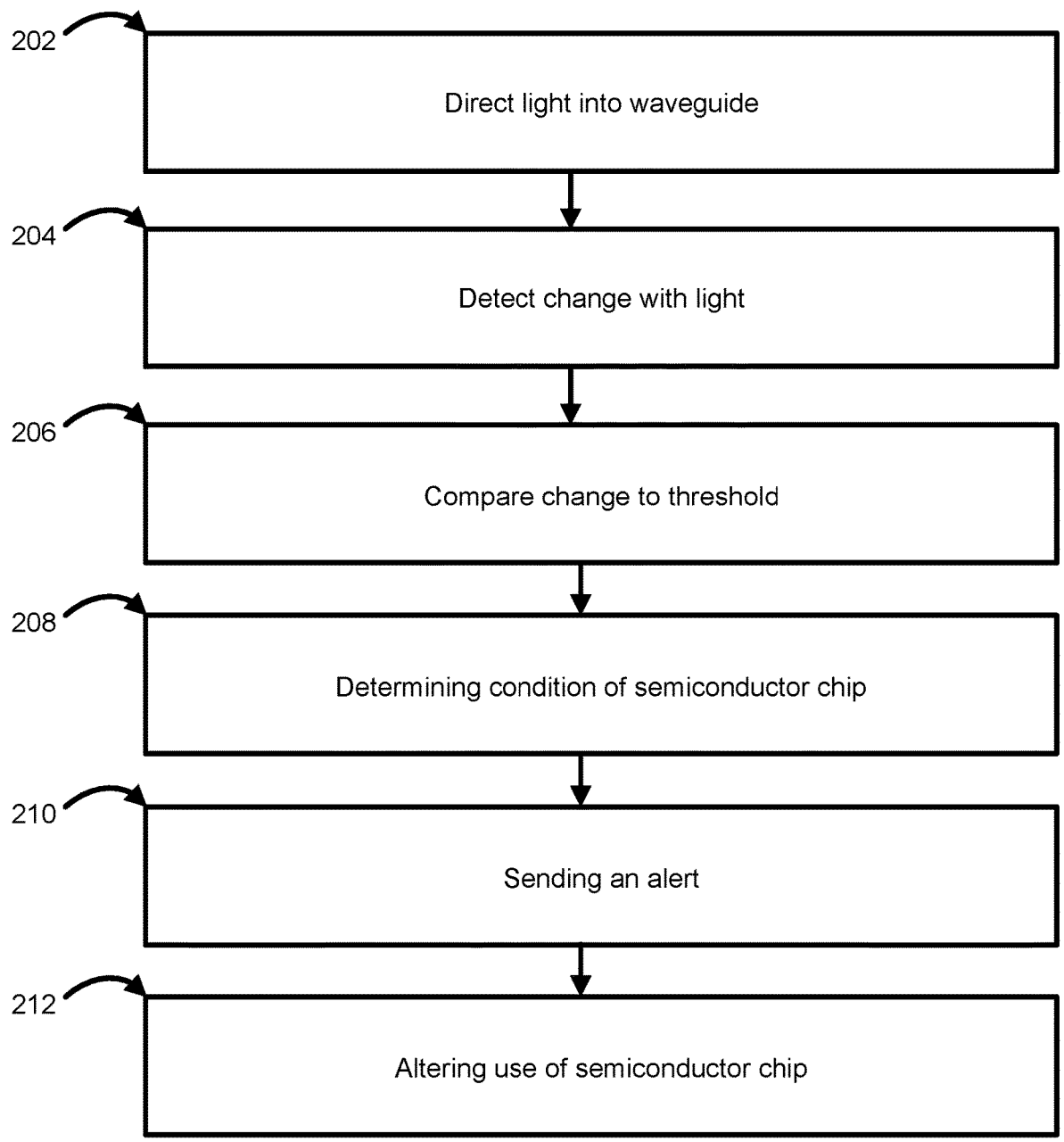
FIG. 3 illustrates an exemplary method associated with a nanophotonic semiconductor design.

FIG. 3 illustrates an exemplary method executed by an electronic device associated with a nanophotonic semiconductor design as disclosed herein. At step 202, light may be directed into waveguide 143 of semiconductor chip 131 (e.g., via waveguide grating 153) at a first frequency (e.g., hertz) or first wavelength (e.g., nanometers). At step 204, a change in light frequency or light wavelength when the light exits at waveguide grating 157 may be detected when compared to the first frequency or first wavelength. At step 206, the change of step 204 compared to a predetermined threshold. At step 208, based on the comparison of step 206, a condition of semiconductor chip 131 may be determined. At step 210, an indication (e.g., an alert) may be sent with regard to the condition of semiconductor chip 131. The condition may be associated with crack propagation, electrical continuity, moisture, or delamination, among other things. At step 212, based on the indication of step 210, the use of semiconductor chip 131 may be altered (e.g., restricting power, powering off, semiconductor chip 131). The method may be iterative and continually compare changes in light. Apparatus 231 of FIG. 5 may help execute the steps of FIG. 3 or provide analysis of the condition of semiconductor chip 131.

Figure 4:
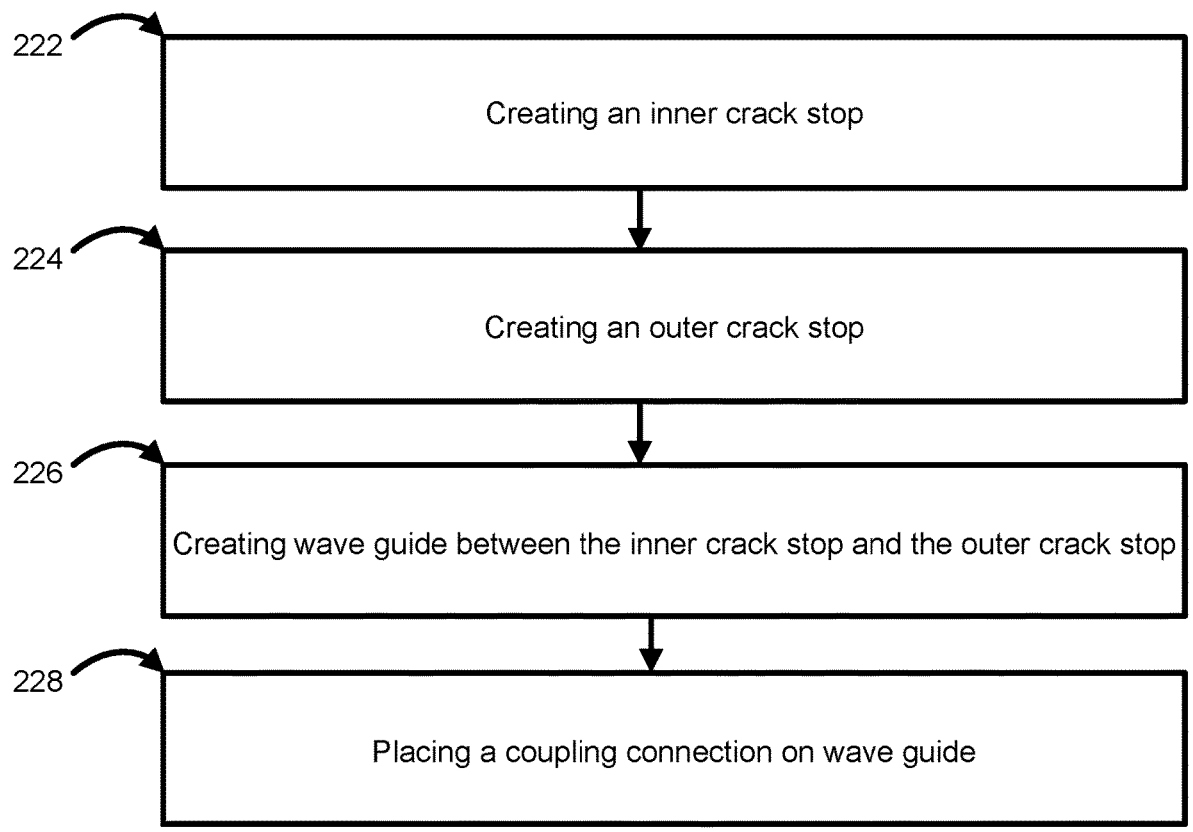
FIG. 4 illustrates an exemplary method for creating a semiconductor chip that uses photonics.

FIG. 4 illustrates an exemplary method for creating a semiconductor chip that uses photonics, such as the nanophotonic design disclosed herein. At step 222, creating an inner crack stop on semiconductor wafer (e.g., semiconductor chip 131). The inner crack stop may be an inner nanocavity array 142 of staggered trenches (e.g., holes or other variations in material density). The crack stops may be formed by creating discontinuities in the thickness of the dielectric layer in the dicing channel near the chip edges. The discontinuities may result in increasing or decreasing the thickness of the dielectric layer. The inner crack stop may be made of a material with a low refractive index. At step 224, creating an outer crack stop on semiconductor chip 131. The outer crack stop may be outer nanocavity array 144 of staggered trenches. The outer crack stop may be made of a material with a low refractive index. At step 226, creating waveguide 143 between the inner crack stop and the outer crack stop. Waveguide 143 may be made of a material with a relatively high refractive index when compared with the inner crack stop material and the outer crack stop material. At step 228, placing a coupling connection on waveguide 143. The coupling connection may be waveguide grating 153 or edge coupling 155 and may be used to inject light onto waveguide 143 or receive light from waveguide 143.

The conventional crack stop is designed with crack resistant conductive and polymeric layer stack trenched into the substrate with lithography or laser-ultrasonic technology. A nanophotonic semiconductor design may use a high refractive index material sandwiched in low refractive index material that may create a structure which acts as an optical waveguide. The combination of low and high refractive index ensures that the light travels substantially within the material which has a high refractive index. As designed, the high refractive index material may be set into the semiconductor to act as a channel which is unlike conventional semiconductor designs.

The choice of crack stop material may significantly reduce the CTE mismatch observed in conventional designs, reduce reliability failures, or reduce yield loss. A nanophotonic semiconductor design may reduce the footprint of the crack stop structures around the periphery of the thin semiconductor (e.g., Si/III-V) die parallel to the kerf (e.g., dicing) region. The vent holes surrounding the waveguide may enable containment of light and may serve to stop crack propagation. The light carried through the waveguide enables BIST (built in self-test) to verify the integrity of the chip.

Conventionally copper-based designs consider current and voltage to inform the design of the crack stop, while the nanophotonic semiconductor design may consider light to inform the design of the crack stop. The semiconductors disclosed herein may be made of one or more materials, such as silicon, germanium, gallium arsenide, III-V materials, elements near the so-called "metalloid staircase" on the periodic table, or other materials.

Figure 5:
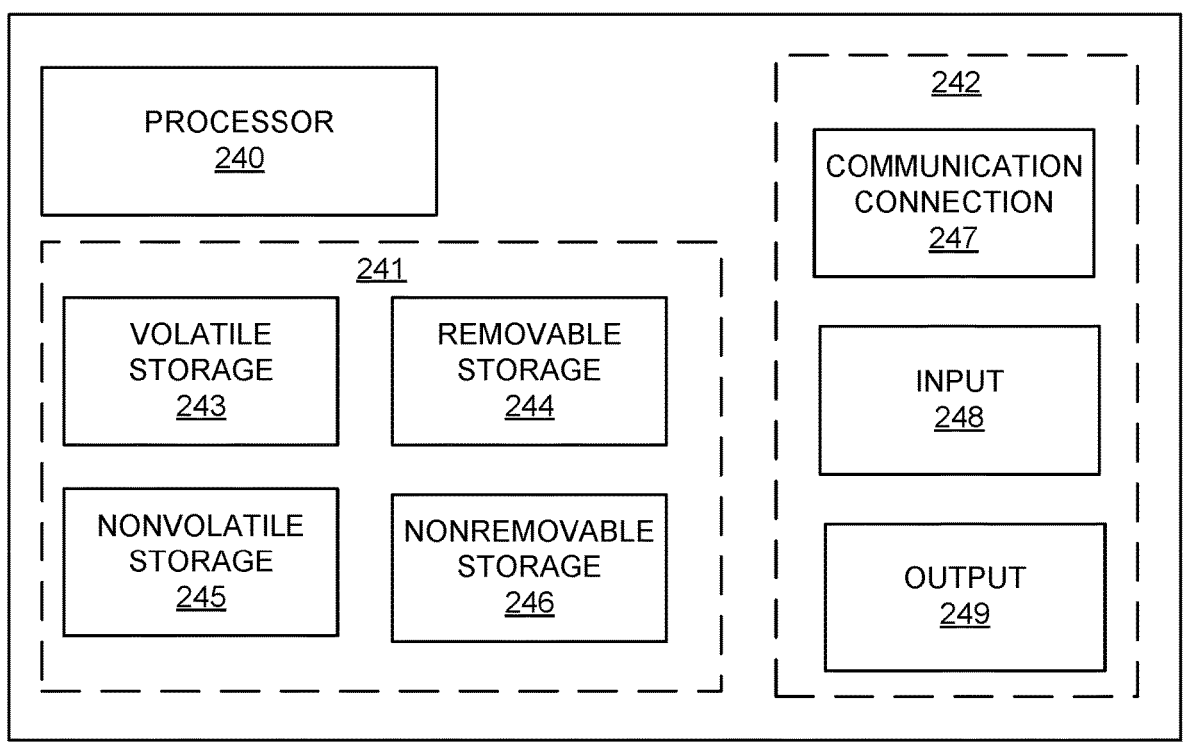
FIG. 5 an exemplary block diagram of a device that may be communicatively connected with semiconductor chip.

FIG. 5 is an exemplary block diagram of a device (e.g., apparatus) that may be communicatively connected with semiconductor chip 131. In an example, apparatus 231 may include hardware or a combination of hardware and software. The functionality to facilitate telecommunications via a telecommunications network may reside in one or combination of network devices (e.g., apparatuses 231). Apparatus 231 may represent or perform functionality of an appropriate apparatus 231, such as a component or various components of a wireless network, a processor, a server, a gateway, a node, a gaming device, or the like, or any appropriate combination thereof. It is emphasized that the block diagram depicted in FIG. 5 is exemplary and not intended to imply a limitation to a specific implementation or configuration. Thus, apparatus 231 may be implemented in a single device or multiple devices (e.g., single server or multiple servers, single gateway or multiple gateways, single controller or multiple controllers). Multiple network entities may be distributed or centrally located. Multiple network entities may communicate wirelessly, via hard wire, or any appropriate combination thereof Apparatus 231 may comprise a processor 240 and a memory 241 coupled to processor 240. Memory 241 may contain executable instructions that, when executed by processor 240, cause processor 240 to effectuate operations.

In addition to processor 240 and memory 241, apparatus 231 may include an input/output system 242. Processor 240, memory 241, and input/output system 242 may be coupled together (coupling not shown in FIG. 5) to allow communications between them. Each portion of apparatus 231 may comprise circuitry for performing functions associated with each respective portion. Thus, each portion may comprise hardware, or a combination of hardware and software. Input/output system 242 may be capable of receiving or providing information from or to a communications device or other network entities configured for telecommunications. For example, input/output system 242 may include a wireless communications (e.g., Wi-Fi or 5G) card. Input/output system 242 may be capable of receiving or sending video information, audio information, control information, image information, data, or any combination thereof. Input/output system 242 may be capable of transferring information with apparatus 231. In various configurations, input/output system 242 may receive or provide information via any appropriate means, such as, for example, optical means (optical light source, such as laser, light emitting diode, etc.), electromagnetic means (e.g., radio frequency (RF), Wi-Fi, Bluetooth), acoustic means (e.g., speaker, microphone, ultrasonic receiver, ultrasonic transmitter), or a combination thereof. In an example configuration, input/output system 242 may comprise a Wi-Fi finder, a two-way GPS chipset or equivalent, or the like, or a combination thereof.

Input/output system 242 of apparatus 231 also may include a communication connection 247 that allows apparatus 231 to communicate with other devices, network entities, or the like. Communication connection 247 may comprise communication media. Communication media typically embody computer-readable instructions, data structures, program modules or other data in a modulated data signal such as a carrier wave or other transport mechanism and includes any information delivery media. By way of example, and not limitation, communication media may include wired media such as a wired network or direct-wired connection, or wireless media such as acoustic, RF, infrared, or other wireless media. The term computer-readable media as used herein includes both storage media and communication media. Input/output system 242 also may include an input device 248 such as keyboard, mouse, pen, voice input device, or touch input device. Input/output system 242 may also include an output device 249, such as a display, speakers, or a printer.

Processor 240 may be capable of performing functions associated with telecommunications, such as functions for processing broadcast messages, as described herein. For example, processor 240 may be capable of, in conjunction with any other portion of apparatus 231, determining a type of broadcast message and acting according to the broadcast message type or content, as described herein.

Memory 241 of apparatus 231 may comprise a storage medium having a concrete, tangible, physical structure. As is known, a signal does not have a concrete, tangible, physical structure. Memory 241, as well as any computer-readable storage medium described herein, is not to be construed as a signal. Memory 241, as well as any computer-readable storage medium described herein, is not to be construed as a transient signal. Memory 241, as well as any computer-readable storage medium described herein, is not to be construed as a propagating signal. Memory 241, as well as any computer-readable storage medium described herein, is to be construed as an article of manufacture.

Herein, a computer-readable storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable storage medium may be volatile, non-volatile, or a combination of volatile and non-volatile, where appropriate.

Memory 241 may store any information utilized in conjunction with telecommunications. Depending upon the exact configuration or type of processor, memory 241 may include a volatile storage 243 (such as some types of RAM), a nonvolatile storage 245 (such as ROM, flash memory), or a combination thereof. Memory 241 may include additional storage (e.g., a removable storage 244 or a non-removable storage 246) including, for example, tape, flash memory, smart cards, CD-ROM, DVD, or other optical storage, magnetic cassettes, magnetic tape, magnetic disk storage or other magnetic storage devices, USB-compatible memory, or any other medium that may be used to store information and that may be accessed by apparatus 231. Memory 241 may comprise executable instructions that, when executed by processor 240, cause processor 240 to effectuate operations to map signal strengths in an area of interest.

While the disclosed systems have been described in connection with the various examples of the various figures, it is to be understood that other similar implementations may be used or modifications and additions may be made to the described examples of a nanophotonic crack stop system without deviating therefrom. For example, one skilled in the art will recognize that a nanophotonic crack stop system as described in the instant application may apply to any environment, whether wired or wireless, and may be applied to any number of such devices connected via a communications network and interacting across the network. Therefore, the disclosed systems as described herein should not be limited to any single example, but rather should be construed in breadth and scope in accordance with the appended claims.

In describing preferred methods, systems, or apparatuses of the subject matter of the present disclosure—nanophotonic crack stop—as illustrated in the Figures, specific terminology is employed for the sake of clarity. The claimed subject matter, however, is not intended to be limited to the specific terminology so selected.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable. It is to be understood that the terminology used herein is for the purpose of describing particular aspects only and is not intended to be limiting.

This written description uses examples to enable any person skilled in the art to practice the claimed subject matter, including making and using any devices or systems and performing any incorporated methods. Other variations of the examples are contemplated herein. It is to be appreciated that certain features of the disclosed subject matter which are, for clarity, described herein in the context of separate embodiments, may also be provided in combination in a single embodiment. Conversely, various features of the disclosed subject matter that are, for brevity, described in the context of a single embodiment, may also be provided separately or in any sub-combination. Further, any reference to values stated in ranges includes each and every value within that range. Any documents cited herein are incorporated herein by reference in their entireties for any and all purposes.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

Methods, systems, and apparatuses, among other things, as described herein may provide for using photonics in semiconductor chips, as disclosed herein. A method, system, computer readable storage medium, or apparatus provides for receiving light from a waveguide of the semiconductor chip; and sending an indication of a condition of the semiconductor chip, which may be based on the light from the waveguide. A method, system, computer readable storage medium, or apparatus provides for receiving light from a waveguide of the semiconductor chip; determining, based on the light from the waveguide, an indication of a condition of the semiconductor chip; and sending the indication of the condition of the semiconductor chip. A semiconductor wafer comprising a waveguide. The semiconductor wafer may include a substrate. The waveguide is between the inner crack stop structure and an outer crack stop structure, wherein the outer crack stop structure is closer to a die edge than the inner crack stop structure. The waveguide is enclosed by material of the semiconductor wafer with a lower refractive index. The waveguide is substantially along a perimeter of the semiconductor wafer. The inner crack stop structure may be further away from a die edge than the outer crack stop structure. A plurality of waveguide gratings may direct light to a first structure on the semiconductor wafer or away from the semiconductor wafer. The waveguide terminates or commences at a die edge of the semiconductor wafer and receives, via an interface, light from a source external to the semiconductor wafer. The waveguide terminates or commences at a die edge of the semiconductor wafer and transmits, via an interface (e.g., a connection), light to a source external to the semiconductor wafer for processing. The waveguide may terminate or commence at a die edge of the semiconductor wafer and may transmit light (e.g., infrared or ultraviolet) to a source external to the semiconductor wafer for processing through an interface. All combinations in this paragraph and the previous paragraphs (including the removal or addition of steps or components) are contemplated in a manner that is consistent with the other portions of the detailed description.

What is claimed:

1. A semiconductor wafer comprising:
an outer crack stop structure near a die edge periphery along a perimeter of a die edge;
an inner crack stop structure near the die edge periphery along the perimeter of the die edge; and
a waveguide configured to direct light,
the waveguide is between the inner crack stop structure near the die edge periphery along the perimeter of the die edge and the outer crack stop structure near the die edge periphery along the perimeter of the die edge, and
the waveguide is substantially positioned along two or more sides of the perimeter of the die edge.

2. The semiconductor wafer of claim 1, wherein the outer crack stop structure near the die edge periphery is closer to the die edge than the inner crack stop structure near the die edge periphery.

3. The semiconductor wafer of claim 1, further comprising;
a plurality of waveguide gratings that directs light to a first structure on the semiconductor wafer or away from the semiconductor wafer.

4. The semiconductor wafer of claim 1, wherein the waveguide terminates or commences at or near the die edge of the semiconductor wafer.

5. The semiconductor wafer of claim 1, wherein the waveguide terminates or commences at or near the die edge of the semiconductor wafer and comprises a connection to receive light from a source external to the semiconductor wafer.

6. The semiconductor wafer of claim 1, wherein the waveguide terminates or commences at or near the die edge of the semiconductor wafer and comprises a connection to transmit light to a source external to the semiconductor wafer.

7. The semiconductor wafer of claim 1, wherein the waveguide comprises a nanophotonic sensor.

8. The semiconductor wafer of claim 1, wherein the inner crack stop structure, near the die edge periphery, comprises a nanocavity array.

9. The semiconductor wafer of claim 1, wherein the outer crack stop structure, near the die edge periphery, comprises a nanocavity array.

10. The semiconductor wafer of claim 1, wherein the inner crack stop structure near the die edge periphery and the outer crack stop structure near the die edge periphery comprises a nanocavity array.

11. The semiconductor wafer of claim 1, wherein the inner crack stop structure near the die edge periphery comprises a lower refractive index than the waveguide.

12. The semiconductor wafer of claim 1, wherein the waveguide is enclosed by material of the semiconductor wafer with a lower refractive index.

13. The semiconductor wafer of claim 1, wherein the waveguide is substantially parallel with the outer crack stop structure near the die edge periphery when in between the inner crack stop structure near the die edge periphery and the outer crack stop structure near the die edge periphery.

14. A semiconductor die comprising:
an outer crack stop structure near a semiconductor die edge periphery of the semiconductor die;
an inner crack stop structure near the semiconductor die edge periphery; and
a waveguide configured to direct light,
the waveguide is between the inner crack stop structure near the semiconductor die edge periphery and the outer crack stop structure near the semiconductor die edge periphery, and
the waveguide is substantially positioned along two or more sides of a perimeter of the semiconductor die.

15. The semiconductor die of claim 14, wherein the inner crack stop structure near the semiconductor die edge periphery comprises a lower refractive index than the waveguide.

16. The semiconductor die of claim 14, further comprising:
a plurality of waveguide gratings configured to direct light to a first structure on the semiconductor die or away from the semiconductor die.

17. The semiconductor die of claim 14, wherein the waveguide terminates or commences at or near the semiconductor die edge periphery of the semiconductor die.

18. The semiconductor die of claim 14, wherein the waveguide comprises a nanophotonic sensor.

19. The semiconductor die of claim 14, wherein the inner crack stop structure, near the semiconductor die edge periphery, comprises a nanocavity array.

20. The semiconductor die of claim 14, wherein the outer crack stop structure, near the semiconductor die edge periphery, comprises a nanocavity array.

* * * * *